United States Patent [19]

Nagayama et al.

[11] Patent Number: 5,632,910
[45] Date of Patent: May 27, 1997

[54] MULTILAYER RESIST PATTERN FORMING METHOD

[75] Inventors: Tetsuji Nagayama; Tetsuo Gocho, both of Kanagawa, Japan

[73] Assignee: Sony Corporation, Tokyo, Japan

[21] Appl. No.: 356,587

[22] Filed: Dec. 15, 1994

[30] Foreign Application Priority Data

Dec. 24, 1993 [JP] Japan .................................. 5-327411

[51] Int. Cl.⁶ ........................................ H01L 21/302
[52] U.S. Cl. .................. 216/47; 216/72; 430/323; 430/325; 438/717; 438/950
[58] Field of Search ........................ 156/661.11, 643.1; 216/47, 72; 427/571, 575, 579; 430/323, 325, 326

[56] References Cited

U.S. PATENT DOCUMENTS

| | | | |
|---|---|---|---|
| 4,566,940 | 1/1986 | Itsumi et al. | 156/661.11 X |
| 4,589,952 | 5/1986 | Behringer et al. | 156/661.11 X |
| 4,680,084 | 7/1987 | Heimann et al. | 216/48 X |
| 4,790,903 | 12/1988 | Sugano et al. | 156/661.11 X |
| 5,038,713 | 8/1991 | Kawakami et al. | 216/69 X |
| 5,324,553 | 6/1994 | Ovshinsky et al. | 427/571 |

FOREIGN PATENT DOCUMENTS 104127   5/1991   Japan .

*Primary Examiner*—Thi Dang
*Attorney, Agent, or Firm*—Hill, Steadman & Simpson

[57] ABSTRACT

A multilayer resist pattern forming method patterns a lower resist layer formed over the stepped surface of a workpiece by a high-speed, highly anisotropic ion mode etching using an intermediate pattern formed by etching an intermediate layer formed by a high-density plasma CVD process as a substantial etching mask. The intermediate layer formed by the high-density plasma CVD process has a dense film quality and highly resistant to ion bombardment. Therefore, the intermediate resist pattern is neither thinned nor contracted and, consequently, the lower resist pattern can be formed precisely in conformity with the design rule. Since the high-density plasma promotes interaction between source gases to enable the intermediate layer to be formed at a comparatively low processing temperature, which prevents damaging the lower resist layer by heat.

12 Claims, 4 Drawing Sheets

MULTILAYER RESIST PATTERN FORMING METHOD

BACKGROUND OF THE INVENTION

1. Field of the Invention

The present invention relates to a method of forming a multilayer resist pattern and, more particularly, to a method of forming, for example, a three-layer resist pattern (tri-level resist pattern) having a lower resist pattern formed of an organic material and an intermediate resist pattern substantially serving as an etching mask, capable of improving the resistance to ion bombardment of the intermediate resist pattern and of reducing critical dimension loss of the lower resist pattern.

2. Description of the Related Art

Demand for microprocessing techniques has been further enhanced with the shift of the design rule for designing semiconductor devices, such as LSIs, from a half-micron level to a quarter-micron level. Recent photolithographic techniques use exposure light having a short wavelength to enhance resolution, and requires multilayer resist processes because the recent semiconductor devices has a multilayer construction and the surface of the underlying layer on a substrate has large irregularities. The so-called three-layer resist process that uses a composite resist consisting of a comparatively thick lower resist layer capable of absorbing irregularities in the underlying layer and of forming a flat surface, a comparatively thin intermediate layer formed of an inorganic material and serving as a substantial mask pattern for etching the lower resist, and a sufficiently thin upper resist layer to achieve a photolithographic process in a high resolution is proposed by J. M. Morran and D. Maydan in J. Vac. Sci. Technol., 16, 1620 (1979).

In the three-layer resist process, the upper resist layer is exposed and developed in a desired pattern, the intermediate layer is etched by RIE (reactive ion etching) in a desired pattern by using the patterned upper resist layer as an etching mask, and then the lower resist layer is etched in a desired pattern by anisotropic dry etching using $O_2$ gas and the patterned upper and the intermediate layers as an etching mask. This three-layer resist process is capable of forming a minute resist pattern in a high resolution over the irregular surface of an underlying layer.

Incidentally, when oxygen radicals (hereinafter referred to as "O*") are increased by increasing the gas pressure to etch the lower resist layer formed of an organic material at a high etching rate in a patterning process for patterning the lower resist layer by anisotropic etching using $O_2$ gas, O* form undercut in the lower portion of the intermediate layer by isotropic oxidation to deteriorate the pattern of the intermediate layer.

On the other hand, etching conditions including low gas pressure and high bias power for increasing the mean free path of ions and substrate bias must be employed to carry out highly anisotropic etching and to prevent forming an undercut in the lower resist layer; that is, highly anisotropic etching is carried out by ion mode etching using the perpendicular incidence characteristic and the high kinetic energy of oxygen ions (hereinafter referred to as "O+") in combination. However, the employment of such etching conditions brings about the reduction of the etch selectivity between the intermediate layer and the underlying layer, which is one of the impediment to the practical application of the multilayer resist. This problem will be described with reference to FIGS. 1A, 1B and 1C.

FIG. 1A shows a workpiece provided with an upper resist layer 6 formed by a method of forming a second tungsten polycide wiring pattern in a SRAM fabricating process. A polysilicon layer and a tungsten silicide layer are formed sequentially over a stepped layer insulating film 2 so as to conform to the shapes of the steps to form a second tungsten polycide layer 3. In FIG. 1A, indicated at 7 is a first tungsten polycide gate wiring pattern and at 1 is a Si substrate. A device forming regions, a gate insulating film and the like are omitted. A lower resist layer 4 having a thickness large enough to absorb the steps of the second tungsten polycide layer 3 and to form a flat surface, an intermediate layer 5 formed of spin-on-glass (SOG) and a thin upper resist layer are formed in that order over the surface of the second tungsten polycide layer 3. The upper resist layer is patterned by a photolithographic etching process to form the upper resist pattern 6. Since the photolithographic etching process is applied to a flat surface, the upper resist pattern 6 can be formed in a high resolution. The pattern lines of the upper resist pattern 6 have sharp rectangular cross section having, for example, a width of 0.35 μm. The intermediate layer 5 is patterned by a RIE process using the upper resist pattern 6 to form an intermediate resist pattern 5a as shown in FIG. 1B. The lines of the intermediate resist pattern 5a also have sharp shapes having a width of 0.35 μm.

Then, the lower resist layer 4 is etched with $O_2$ gas. The thin upper resist pattern 6 is etched out halfway through the etching process and the intermediate resist pattern 5a is exposed. Thereafter, the intermediate resist pattern 5a functions as a substantial etching mask. Since the lower resist layer 4 is formed in a thickness large enough to absorb the steps of the underlying layer for the purpose of the three-layer resist process, the lower resist layer 4 must be etched at a high etching rate. Therefore, the lower resist layer 4 is etched at a high etching rate by an ion mode highly anisotropic etching process using sputtering in combination. Since the intermediate resist pattern 5a of SOG serving as a substantial etching mask is formed at a comparatively low temperature of 200° C. at the highest to obviate adverse thermal influence on the lower resist layer 4, the intermediate resist pattern 5a has a small density and a low resistance to ion bombardment. Therefore, the thickness of the intermediate resist pattern 5a and the width of the lines of the intermediate resist pattern 5a decrease with the progress of the etching process; that is, as shown in FIG. 1C, the edges of the lines of the intermediate resist pattern 5a are etched by a width x, causing pattern shift and, consequently, the width of the lines of the lower resist pattern 4a as finished is (0.35—2x) μm, which is smaller than the design width of 0.35 μm by a critical dimension loss of 2x and the width of the lines of the second tungsten polycide wiring pattern is reduced accordingly.

OBJECT AND SUMMARY OF THE INVENTION

Accordingly, it is a first object of the present invention to provide a multilayer resist pattern forming method capable of forming an intermediate resist pattern excellent in resistance to ion bombardment, having a sufficiently large etch selectivity relative to an underlying lower resist layer, securing a practical etching rate and capable of avoiding contraction and pattern shift.

A second object of the present invention is to provide a multilayer resist pattern forming method capable forming an intermediate layer of a material well conformable to ordinary silicon processing, having high resistance to ion bombardment and a sufficiently large etch selectivity relative to an underlying lower resist layer, securing a practical etching rate and capable of avoiding contraction and pattern shift, without using any special material.

A third object of the present invention is to provide a multilayer resist pattern forming method capable of forming an intermediate layer of a material well conformable to ordinary silicon processing, having high resistance to ion bombardment and a sufficiently large etch selectivity relative to an underlying lower resist layer of an organic material, securing a practical etching rate and capable of avoiding contraction and pattern shift at a comparatively lower temperature of 200° C. at the highest without adversely affecting the underlying resist layer.

A multilayer resist pattern forming method according to the present invention has been developed to solve the aforesaid problems and forms an intermediate layer for a multilayer resist process by a plasma processing system that uses a plasma having a plasma density not less than $1\times10^{11}/cm^3$ and less than $1\times10^{14}/cm^3$. A plasma processing system suitable for carrying out the multilayer resist pattern forming method of the present invention is, for example, an electron cyclotron resonance plasma processing system (ECR plasma processing system), a helicon wave plasma processing system, an inductively coupled plasma processing system, a transformer coupled plasma processing system or the like capable of carrying out a plasma CVD process by using a plasma having a high plasma density of not less than $1\times10^{11}/cm^3$ and less than $1\times10^{14}/cm^3$. Since the technical details of these plasma processing systems are explained in detail in relevant technical reports, the description thereof will be omitted. Introductory description of these plasma processing systems is published in "Monthly Semiconductor World", Press Journal, Vol. 10, p. 59 (1993). As is apparent from the description, research and development activities have been made in recent years for the practical application of precision dry etching techniques using a high-density plasma. The present invention is based on a fact that an intermediate layer of a multilayer resist, having excellent resistance to ion bombardment and a high density could be formed by a plasma processing system using a high-density plasma. The generally used conventional RF excited parallel flat plate type plasma processing system uses a plasma having a plasma density on the order of $1\times10^9/cm^3$ and the conventional parallel flat plate type magnetron plasma processing system uses a plasma having a plasma density on the order of $1\times10^{10}/cm^3$, and these conventional plasma processing systems needs a process temperature of several hundreds degrees Celsius. Therefore, these conventional plasma processing systems are not suitable for carrying out the multilayer resist pattern forming method of the present invention.

The multilayer resist pattern forming method of the present invention uses a plasma processing system using a high-density plasma and forms a multilayer resist layer including an intermediate layer of a single film of $SiO_2$ or $Si_3N_4$, or a composite film of $SiO_2$ and $Si_3N_4$ at a process temperature in the temperature range of a room temperature to 200° C., more preferably, in the temperature range of 50° C. to 150° C. The room temperature referred to by this specification corresponds to the room temperature of a clean room for ordinary semiconductor device fabricating processes and is on the order of 20° C.

An essential point of the present invention is to form the intermediate layer of a multilayer resist pattern by a plasma CVD process which is carried out by a plasma processing system capable of using a plasma having a plasma density not less than $1\times10^{11}/cm^3$ and less than $1\times10^{14}/cm^3$. Since the multilayer resist pattern forming method of the present invention uses a plasma having a plasma density two to three digits higher than that of the plasma used by the conventional RF excited parallel flat plate type plasma processing system, source gases can be efficiently dissociated by the high-density plasma at a low process temperature of 200° C. at the highest and the process for forming the intermediate layer can be stoichiometrically satisfactorily controlled. The intermediate layer formed by the multilayer resist pattern forming method of the present invention has an improved density, an improved refractive index, an improved water-resisting property and an improved impurity-barrier property.

The film quality improving effect is insignificant when the plasma density is less than $1\times10^{11}/cm^3$. The upper limit of the plasma density is closely related with the gas pressure in the processing chamber of the plasma processing system; a plasma density of $1\times10^{14}/cm^3$ is high enough to cause perfect dissociation under a gas pressure on the order of $10^{-1}$ Pa, which is an ordinary working pressure of the processing chamber.

The morphology of a film formed at a process temperature lower than the room temperature is unsatisfactory and a process temperature higher than 200° C. affect adversely the underlying resist film and deteriorates the same. Therefore, an appropriate temperature range is from a room temperature to 200° C.

Thus, the multilayer resist pattern forming method of the present invention is capable of forming an intermediate layer having excellent resistance to ion bombardment without thermally damaging the underlying lower resist layer and of forming a lower resist pattern not subject to pattern shift.

BRIEF DESCRIPTION OF THE DRAWINGS

The above and other objects, features and advantages of the present invention will become more apparent form the following description taken in connection with the accompanying drawings, in which.

DETAILED DESCRIPTION OF THE PREFERRED EMBODIMENTS

A multilayer resist pattern forming method in a first embodiment according to the present invention will be described as applied to forming a three-layer resist including an intermediate layer of $SiO_2$, for patterning a second tungsten polycide wiring layer to form a second tungsten polycide wiring pattern in a SRAM fabricating process. This multilayer resist pattern forming method is carried out by an ECR plasma processing system shown in FIG. 3 capable of generating a plasma having a plasma density of $1\times10^{11}/cm^3$ or above.

Figure 3:
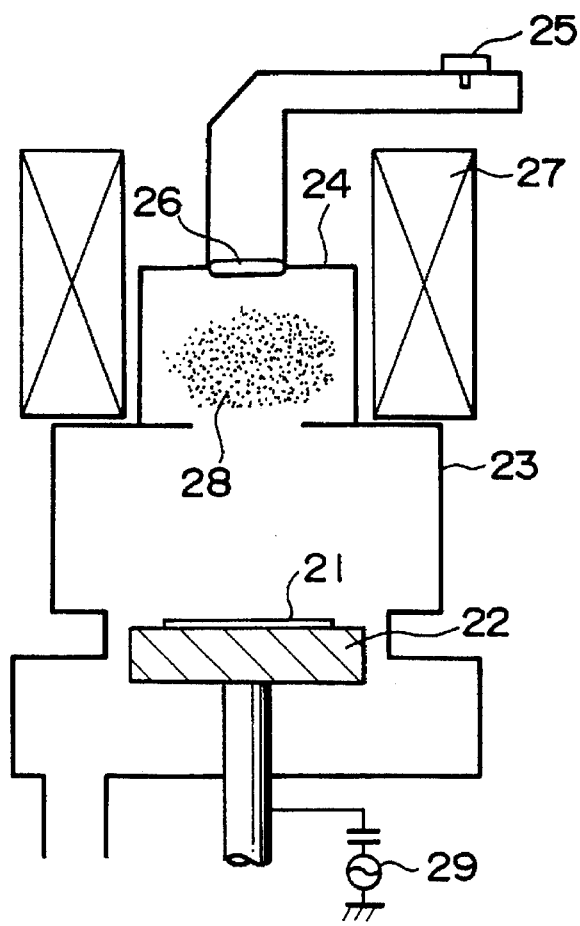
FIG. 3 is a schematic sectional view of an ECR plasma processing system for carrying out the multilayer resist pattern forming methods in the first and the second embodiment according to the present invention.

Referring to FIG. 3, the ECR plasma processing system introduces a 2.45 GHz microwave generated by a magnetron 25 into a plasma generating vessel 24 through a waveguide and a quartz window 26. Source gases supplied through supply pipes, not shown, into the plasma generating vessel 24 is dissociated by ECR discharge caused by the interaction of a magnetic field of 0.0875 T created by a solenoid coil 27 surrounding the plasma generating chamber 24 and the 2.45 GHz microwave to generate a high-density plasma 28 within the plasma generating vessel 24. The density of the plasma 28 can be controlled by regulating the power of the microwave. A workpiece 21 mounted on a substrate stage 22 disposed in a plasma processing vessel 23 is processed for ECR plasma CVD by the plasma 28 diffused within the plasma processing vessel 23. A bias RF power source 29 is connected to the substrate stage 22 to apply a bias voltage to the workpiece 21.

Figure 2A:
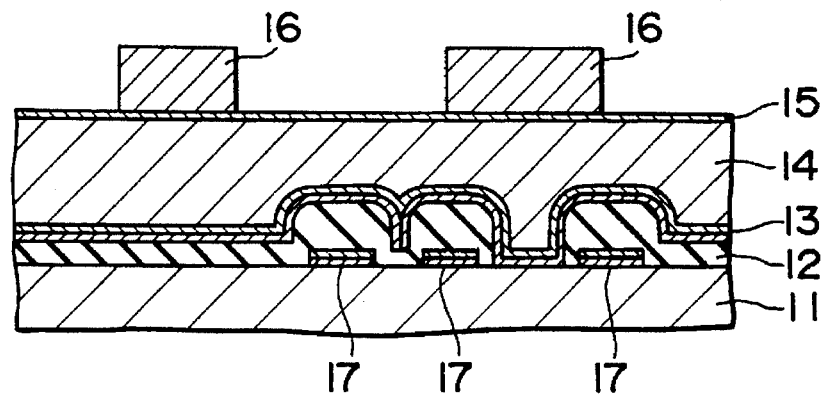
FIGS. 2A, 2B and 2C are schematic sectional views of a workpiece in different phases of multilayer resist pattern forming methods in first, second, third and fourth embodiments according to the present invention.
Figure 2B:
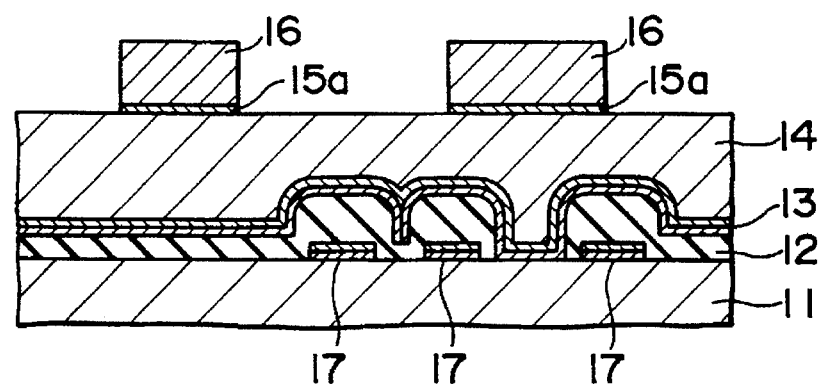
Figure 2C:
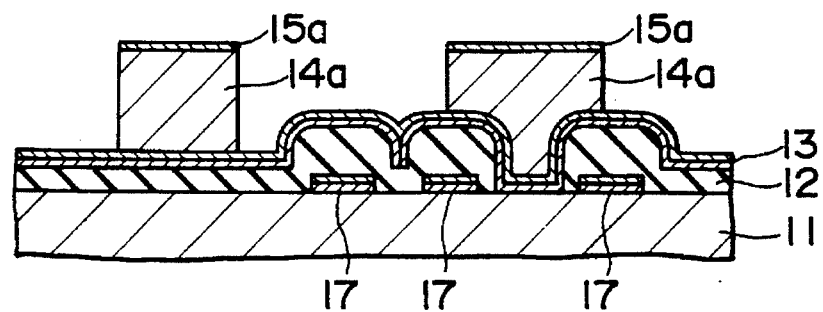

Referring to FIG. 2A, a polysilicon film and a tungsten silicide film were formed successively over the stepped surface of a layer insulating film 12 covering a first tungsten polycide gate wiring pattern 17 formed on a silicon substrate 11 so as to conform to the stepped surface of the layer insulating film 12 to form a second tungsten polycide layer 13. In FIGS. 2A, 2B and 2C, device forming regions, a gate insulating film and such are omitted for simplicity. Then, a lower resist layer 14 of an organic material was formed in a thickness large enough to absorb the steps of the second tungsten polycide layer 13 and to form a flat surface over the second tungsten polycide layer 13. The organic material forming the lower resist layer 14 was, for example, a novolak positive resist (OFPR-800, produced by Tokyo Ohka Kogyo K.K.). The lower resist layer 14 was formed by spin-coating method and the thickness of comparatively thick portions of the lower resist layer 14 corresponding to portions of the layer insulating film 12 between the steps was about 1.0 µm.

An intermediate layer 15 of $SiO_2$ was formed in a thickness of, for example, 0.2 µm over the flat surface of the lower resist layer 14 by the ECR plasma processing system of FIG. 3 under the following process conditions.

$SiH_4$ gas supply rate: 20 sccm
$N_2O$ gas supply rate: 40 sccm
Gas pressure: 0.1 Pa
Output power of the magnetron: 1500 W
Plasma density: $3 \times 10^{11}/cm^3$
RF bias power: 0 W
Temperature of the workpiece: 150° C.

The $SiO_2$ intermediate layer 15 thus formed had a dense film quality. Since the temperature 150° C. of the substrate 11 is high enough to promote the interaction between the $SiH_4$ gas and the $N_2O$ gas for high-density plasma CVD and is moderate to the lower resist layer 14, the thermal deterioration of the lower resist layer 14 did not occur.

An upper resist pattern 16 was formed in a predetermined pattern on the intermediate layer 15. The upper resist pattern 16 was formed by exposing an about 0.7 µm thick coating of a chemically amplified negative resist (SAL-601, produced by Shipley Co.) to laser light emitted by a KrF excimer laser and subjecting the exposed coating to a developing process. The lines of the upper resist pattern 16 had sharp rectangular cross sections having a width of, for example, 0.35 µm.

Then, the workpiece was placed in an etching chamber of a magnetically enhanced microwave plasma reactive ion beam etching system to etch the intermediate layer 15 by using the upper resist pattern 16 as an etching mask, for example, under the following etching conditions.

$CHF_3$ gas supply rate: 45 sccm
$CH_2F_2$ gas supply rate: 5 sccm
Gas pressure: 0.3 Pa
Power of output microwave: 1200 W
RF bias power: 200 W (800 kHz)
Temperature of the workpiece: 20° C.

Figure 1A:
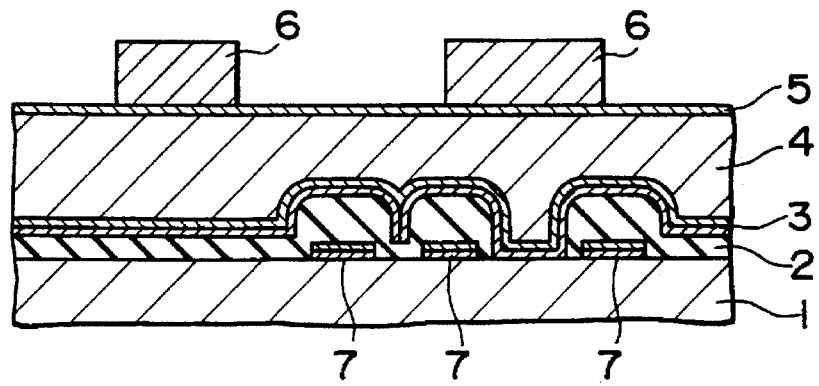
FIGS. 1A, 1B and 1C are schematic sectional views of a workpiece in different phases of a conventional multilayer resist pattern forming method.
Figure 1B:
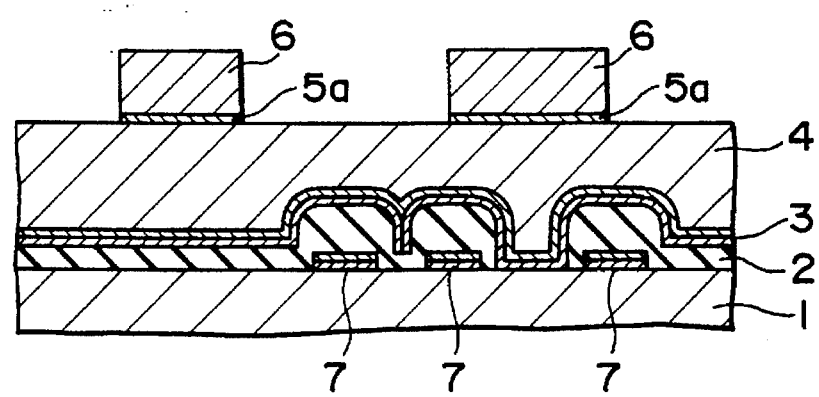
Figure 1C:
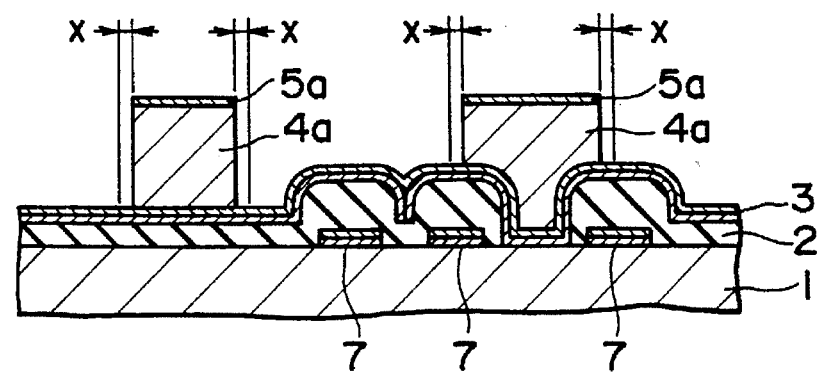

Thus, an intermediate resist pattern 15a corresponding to the upper resist pattern 16 as shown in FIG. 1B was formed. The lines of the intermediate resist pattern 15a had sharp rectangular cross sections having a width of 0.35 µm.

Then, the lower resist layer 14 was etched, for example, under the following etching conditions.

$CO_2$ gas supply rate: 50 sccm
Gas pressure: 0.3 Pa
Output power of the magnetron: 600 W
RF bias power: 50 W (800 kHz)
Temperature of the workpiece: −50° C.

The upper resist pattern 16 was etched out halfway through this etching process and, thereafter, the intermediate resist pattern 15a served substantially as an etching mask until the etching of the lower resist layer 14 was completed. Since the intermediate resist pattern 15a had a dense film quality, the lower resist layer 14 could be etched at a high selective etching ratio and neither the contraction nor the reduction of the intermediate resist pattern 15a occurred. The lines of the lower resist pattern 14a were formed in sharp shapes and in a width of 0.35 µm and no pattern shift occurred. The etching process using $CO_2$ gas as an etching gas for etching an organic film, employed in this embodiment is disclosed in Japanese Patent Application No. 05-165406 filed by the applicant of the present patent application.

Then, the stepped second tungsten polycide wiring layer 13 was patterned by using the intermediate resist pattern 15a and the lower resist pattern 14a as a mask. The intermediate resist pattern 15a may be removed by plasma etching or wet etching, and only the lower resist pattern 14a may be used for etching the second tungsten polycide layer 13. When both the intermediate resist pattern 15a and the lower resist pattern 14a are used for etching the second tungsten polycide layer 13, etching may be carried out under etching conditions that will form a protective film of a reaction product produced by the action of the etching gas over the side surfaces. When both the intermediate resist pattern 15a and the lower resist pattern 14a were used, the etching mask had an improved resistance to ion bombardment and pattern shift did not occur in the pattern formed by etching the second tungsten polycide layer 13. When only the lower resist pattern 14a is used, etching conditions that will produce a protective film materials produced by the dissociation of the lower resist pattern 14 may be employed. In either case, no pattern shift occurs in the wiring pattern formed by etching the second tungsten wiring layer 13 and the wiring pattern can be formed in the design width because the lines of the lower resist pattern 14a have sharp shapes having a width of 0.35 µm and side surfaces perpendicular to the surface of the substrate 11.

A multilayer resist pattern forming method in a second embodiment according to the present invention is carried out by the ECR plasma CVD system of FIG. 3. This multilayer resist pattern forming method will be described as applied to forming a three-layer resist including an intermediate layer of $Si_3N_4$, for patterning a second tungsten polycide wiring layer to form a second tungsten polycide wiring pattern in a SRAM fabricating process.

The multilayer resist pattern forming method will be described with reference to FIGS. 2A, 2B and 2C. Since the steps of processing the workpiece to form a lower resist layer 14 and layers underlying the lower resist layer 14 are the same as those of the multilayer resist pattern forming method in the first embodiment, the description thereof will be omitted. An intermediate layer 15 of, for example, 0.2 μm in thickness was formed over the flat surface of the lower resist layer 14 by the ECR plasma CVD system of FIG. 3 under the following conditions.

$SiH_4$ gas supply rate: 20 sccm $NH_4$ gas supply rate: 40 sccm $N_2$ gas supply rate: 50 sccm Gas pressure: 0.1 Pa Power of output microwave: 1500 W Plasma density: $3\times10^{11}/cm^3$ RF bias power: 0 W Temperature of the workpiece: 150° C.

The intermediate layer 15 of $Si_3N_4$ having a dense film quality was formed. The temperature 150° C. of the workpiece is high enough to promote interaction between the $SiH_4$ gas, the $NH_3$ gas and the $N_2$ gas for high-density plasma CVD and is a comparatively moderate temperature to the lower resist layer 14. Therefore, the thermal deterioration of the lower resist layer 14 did not occur. Then, an upper resist layer was formed and patterned to form an upper resist pattern by the same processes as those carried out by the multilayer resist pattern forming method in the first embodiment, and then the intermediate layer 15 was etched under the following etching conditions.

$CHF_3$ gas supply rate: 40 sccm $O_2$ gas supply rate: 10 sccm

Gas pressure: 0.3 Pa

Power of output microwave: 1000 W

RF bias power: 100 W (800 kHz)

Temperature of the workpiece: 20° C.

An intermediate resist pattern 15a was formed under the upper resist pattern 16 as shown in FIG. 2B. The lines of the intermediate resist pattern 15a had sharp rectangular cross sections having a width of 0.35 μm. Subsequently, the lower resist layer 14 was etched by using the upper resist pattern 16 and the intermediate resist pattern 15a under the following etching conditions.

$O_2$ gas supply rate: 20 sccm $S_2Cl_2$ gas supply rate: 10 sccm

Gas pressure: 0.3 Pa

Power of output microwave: 600 W

RF bias power: 30 W (800 kHz)

Temperature of the workpiece: −50° C.

The upper resist pattern 16 was etched out halfway through the etching process and the intermediate resist pattern 15a served substantially as an etching mask after the upper resist pattern 16 had been etched out. Although the resistance to ion bombardment of the intermediate resist pattern 15a of $Si_3N_4$ is lower than that of the intermediate resist pattern 15a of $SiO_2$ formed by the multilayer resist pattern forming method in the first embodiment, there arises no problem when the $S_2Cl_2$ gas is used in combination with the $O_2$ gas and an anisotropic etching is carried out at a low RF bias power. Neither the contraction nor the reduction of the intermediate resist patter 15a occurred, a sharp lower resist pattern 14a having lines of 0.35 μm in width was formed.

A multilayer resist pattern forming method in a third embodiment according to the present invention as applied to forming a three-layer resist including an intermediate layer of $SiO_2$ by using an ICP plasma processing system.

Figure 4:
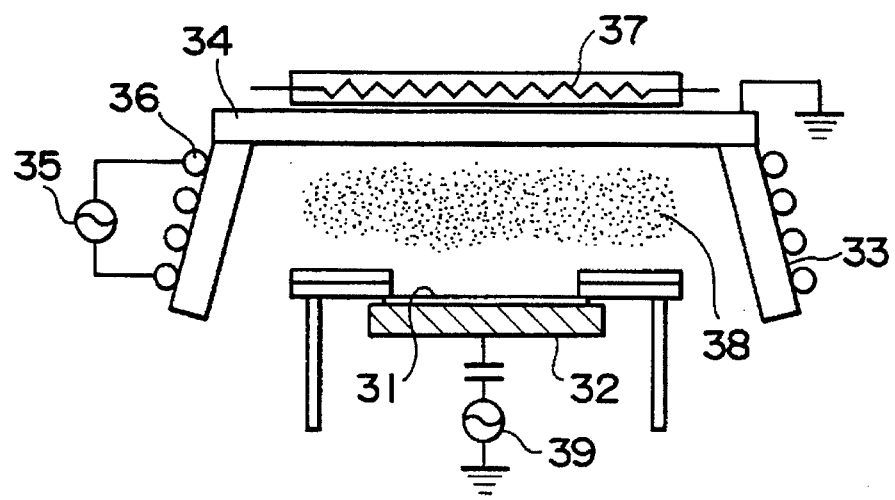
FIG. 4 is a schematic sectional view of an ICP plasma processing system for carrying out the multilayer resist pattern forming method in the third embodiment according to the present invention.

Referring to FIG. 4 showing an ICP plasma processing system, a large multiturn inductive coupling coil 36 is wound around the side wall 33 of a dielectric material, such as quartz, of a processing chamber and is connected to a RF power source 35. RF power is supplied to the inductive coupling coil 36 by the RF power source 35 to generate a high-density plasma 38 in the plasma processing chamber. A substrate biasing RF bias power source 39 is connected to a state 32 for supporting a workpiece 31 to apply a bias voltage to the workpiece 31. The temperature of an upper electrode 34 is controlled by regulating a heater 37. Since the large multiturn inductive coupling coil 36 is capable of operating on a high power to generate a plasma, a plasma having a plasma density greater than that of the plasma used by the foregoing embodiments can be generated, and the temperature of the workpiece may be lower than that of the workpieces processed by the foregoing embodiments. Only essential components are shown in FIG. 4 and the bottom plate of the plasma processing chamber, reaction gas supply pipes and such are omitted.

An intermediate resist pattern included in a multilayer resist pattern for patterning a second tungsten polycide wiring layer was formed by this multilayer resist pattern forming method, which will be described with reference to FIGS. 2A, 2B and 2C. Since steps of processing the workpiece for forming a lower resist layer 14 and layers underlying the lower resist layer 14 are the same as those of the multilayer resist pattern forming method in the first embodiment, the description thereof will be omitted. An intermediate layer 15 of $SiO_2$ having a thickness of, for example, 0.2 μm was formed over the flat surface of the lower resist layer 14 by the aforesaid ICP plasma processing system under the following processing conditions.

$SiH_4$ gas supply rate: 20 sccm $N_2O$ gas supply rate: 30 sccm

Gas pressure: 0.13 Pa

Output of RF power source: 2000 W (2 MHz)

Plasma density: $2\times10^{12}/cm^3$

RF bias power: 0 W

Temperature of the workpiece: 100° C.

The intermediate layer 15 thus formed had a dense film quality. Since the temperature of the workpiece is still lower than that of the workpiece processed by the multilayer resist pattern forming method in the second embodiment, the lower resist layer 14 may be formed of an organic material having a comparatively low heat resistance. The intermediate layer 15 was etched to form an intermediate resist pattern 15a by the same process as that employed in the first embodiment, and the lower resist layer 14 was patterned by using the intermediate resist pattern 15a having a high resistance to ion bombardment as an etching mask. Although formed at a comparatively low processing temperature, the intermediate resist pattern 15a formed by the multilayer resist pattern forming method in the third embodiment had a dense film quality, the intermediate resist pattern 15a was not contracted, the lower resist pattern 14a having lines having side surfaces perpendicular to the surface of the substrate 11 and a width of 0.35 μm was formed and pattern shift did not occur in the lower resist pattern 14a.

Figure 5:
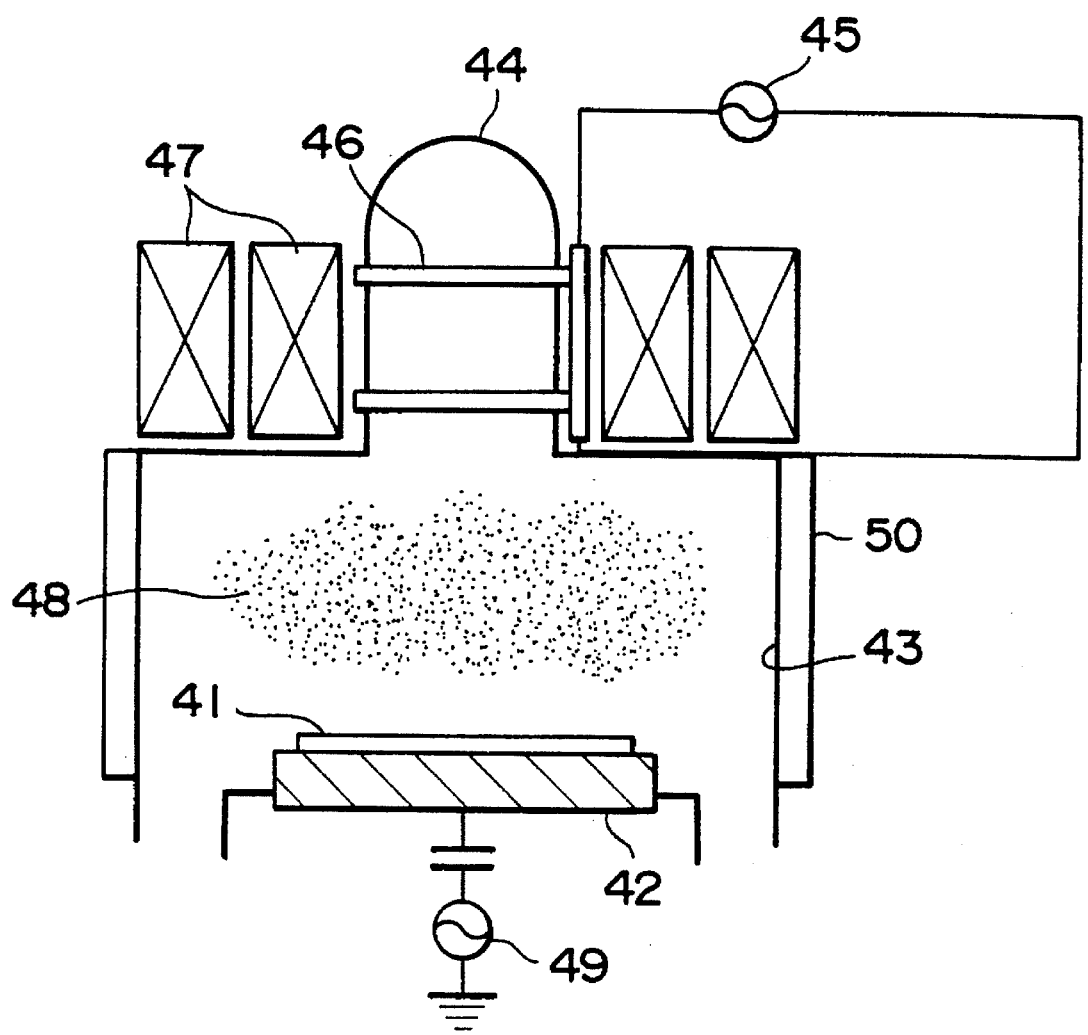
FIG. 5 is a schematic sectional view of a helicon wave plasma processing system for carrying out the multilayer resist pattern forming method in the fourth embodiment according to the present invention.

A multilayer resist pattern forming method in a fourth embodiment according to the present invention forms an intermediate layer included in a three-layer resist by using a helicon wave plasma CVD system shown in FIG. 5.

Referring to FIG. 5, an electric field is created by supplying power from a RF power source 45 to a helicon wave antenna 46 and a magnetic field is created by energizing solenoid coils 47 to generate a whistler wave (helicon wave) in a plasma generating chamber 44 by the interaction between the electric field and the magnetic field, and reaction gases are supplied through inlets, not shown, into a plasma processing chamber 43 to generate a high-density plasma 48 within the plasma processing chamber 43. A multipole magnet 50 disposed so as to surround the plasma processing chamber 43 creates magnetic fields for confining the high-density plasma 48 in the plasma processing chamber 43. When necessary, a substrate biasing power source 49 applies a substrate biasing voltage to a stage 42 supporting a workpiece 41. The helicon wave plasma CVD system is capable of generating a plasma having a plasma density on the order of $1\times10^{13}/cm^3$, which is greater than the plasma densities of the plasmas generated in the foregoing embodiment, owing to the structural characteristic of the helicon wave antenna 46.

The multilayer resist pattern forming method in the fourth embodiment will be described as applied to forming an intermediate layer included in a multilayer resist for patterning a second tungsten polycide wiring layer in a SRAM fabricating process. Since the steps of processing the workpiece to form a lower resist layer 14 and layers underlying the lower resist layer 14 are the same as those of the multilayer resist pattern forming method in the first embodiment, the description thereof will be omitted.

Referring again to FIG. 2A, an intermediate layer 15 of $SiO_2$ having a thickness of, for example, 0.2 μm was formed over the flat surface of the lower resist layer 14 by the helicon wave plasma CVD system of FIG. 5 under the following processing conditions.

$SiH_4$ gas supply rate: 20 sccm $N_2O$ gas supply rate: 30 sccm

Gas pressure: 0.13 Pa

Output of RF power source: 2500 W (13.56 MHz)

Plasma density: $1\times10^{13}/cm^3$

RF bias power: 0 W

Temperature of the workpiece: 50° C.

The intermediate layer 15 of $SiO_2$ thus formed had a dense film quality. Since the temperature of the workpiece is still lower than that of the workpiece processed by the multilayer resist pattern forming method in the third embodiment, the lower resist layer 14 may be formed of an organic material having an inferior heat resistance. The intermediate layer 15 was etched to form an intermediate resist pattern 15a, and the lower resist layer 14 was patterned by using the intermediate resist pattern 15a having a high resistance to ion bombardment as a substantial etching mask to form a lower resist pattern 14a. Although formed at a low processing temperature, the intermediate resist pattern 15a had a dense film quality, the intermediate resist pattern 15a was not contracted, the lower resist pattern 14a having lines having side surfaces perpendicular to the surface of the substrate 11 and a width of 0.35 μm was formed, and pattern shift did not occur in the lower resist pattern 14a.

Although the invention has been described in its specific four embodiments, the present invention is not limited thereto and many changes and variations are possible therein.

For example, the present invention may be carried out by any suitable plasma processing system capable of generating a plasma having a high plasma density not lower than $1\times10^{11}/cm^3$ and lower than $1\times10^{14}/cm^3$, such as a TCP plasma processing system, other than the foregoing three plasma processing systems, i.e., the ECR plasma processing system, the ICP plasma processing system and the helicon wave plasma processing system.

The intermediate layer formed by a plasma CVD method by the high-density plasma processing system may be formed of $SiO_2$, $Si_3N_4$, $SiO_2$ containing desired impurities or $Si_3N_4$ containing desired impurities. The intermediate layer may be a laminated layer consisting of two or three layers of $SiO_2$ and $Si_3N_4$. The intermediate layer may be formed of a material that will cause the underlying resist layer to be etched at a high selective etching ratio, such as $Al_2O_3$. When the intermediate layer is formed of a conductive material, such as $SnO_2$, $In_2O_3$ or ITO, excessive charge up with ions during multilayer resist etching can be prevented.

The lower resist layer of an organic material need not necessarily be formed of novolak positive photoresist; the lower resist layer may be formed of any suitable resist material. Since the purpose of the lower resist layer of an organic material is to form a layer having a flat surface over an underlying stepped layer, the organic material need not be photosensitive and any suitable organic material, such as a polyimide resin, other than the novolak positive photoresist. Since the present invention forms the intermediate layer at a comparatively low processing temperature, which is an important feature of the present invention, restrictions on the heat resistance of the organic material for forming the lower resist layer may be considerably relaxed.

The construction of the underlying layer, conditions for etching the layers, and an etching system may be selectively determined. The etching gas may contain a rare gas, such as He gas or Ar gas. The etching gas may contain $N_2$ gas, $H_2$ gas, $NH_3$ gas, a fluoride gas, a bromide gas, an iodide gas, a gas of a CO group, a gas of a NO group and/or a gas of a SO group. When the sputtering of the underlying layer must be prevented, a multilayer resist pattern can be formed at a high rate, at a low pattern shift, in a highly anisotropic mode without entailing significant damage in the underlying layer, when he lower resist layer is patterned in two stages and the actions of ions is reduced in the second stage.

As is apparent form the foregoing description, according to the present invention, the intermediate layer of the three-layer resist can be formed in a dense film having high resistance to ion bombardment by a plasma processing system capable of generating a plasma having a high plasma density not lower than $1\times10^{11}/cm^3$ and lower than $1\times10^{14}/cm^3$. Therefore, a practical etching rate can be secured, and the pattern shift of the lower resist pattern underlying the intermediate resist pattern due to the thinning of the intermediate resist pattern can be reduced. Accordingly, problems attributable to critical dimension loss in patterning the underlying layer can be solved.

Furthermore, the intermediate layer need not be formed of any special material and may be formed of an ordinary material, such as $SiO_2$ and/or $Si_3N_4$, the intermediate layer has a dense film quality and enhances the selective etching ratio. Accordingly, the multilayer resist pattern forming method of the present invention is satisfactorily applicable to a silicon semiconductor device fabricating process.

The foregoing effect enhances the practical usefulness of the three-layer resist process, and are effective in fabricating semiconductor devices having a high degree of integration and a multilayer interconnection construction based on a minute design rule, to be applied to uses requiring high reliability. The present invention is effective also in patterning a layer formed on a stepped surface in fabricating OEICs and bubble domain storage devices and in forming thin-film magnetic head coils.

What is claimed is:

1. A pattern forming method employing a multilayer resist, said method comprising the steps of:

providing a substrate having a surface;

forming a lower resist layer of an organic material on said surface, said lower resist layer having a thickness large enough to absorb irregularities in said substrate surface and provide a flat surface on said lower resist layer opposite sad substrate;

forming an intermediate resist layer having a thickness of about 0.2 μm and comprising $SiO_2$, $Si_3N_4$, $Al_2O_2$, $SnO_2$, $In_2O_3$ or ITO on the lower resist layer by a high density plasma processing at a plasma density of between about $1\times10^{11}/cm^3$ and $1\times10^{14}/cm^3$ while maintaining the substrate at a temperature of between about 20° C. to about 200° C. to provide intermediate resist layer having a film density sufficient to be resistant to ion bombardment, said forming an intermediate resist layer is carrier out using a plasma processing system selected from the group consisting of inductive coil plasma CVD and helicon wave plasma CVD;

forming an upp resist layer on said intermediate resist layer;

exposing the upper resist layer to laser light and developing the exposed upper resist layer to define an upper resist pattern;

etching the intermediate resist layer by reactive ion etching methods using the upper resist pattern as a mask to define an intermediate resist pattern;

anistropically etching the lower resist layer at a high selective etching ratio using the upper resist pattern and intermediate resist pattern as a mask to define a substantially critically-dimensioned lower resist pattern useful for further pattern processing, the etching of the lower resist pattern being carried out using an etching gas selected from $CO_2$ and a mixture of $O_2$ and a sulfur halide, the etching of the lower resist pattern being carried out without contraction or reduction of the intermediate resist pattern.

2. A method as defined in claim 1, wherein the substrate surfaced is stepped.

3. A method as defined in claim 1, wherein the substrate includes a wiring pattern.

4. A method as defined in claim 1, wherein the intermediate resist layer is $SiO_2$.

5. A method as defined in claim 1, wherein the step of forming an intermediate resist layer is performed in a high density plasma processing system selected from electron cyclotron resonance plasma processing systems, helicon wave plasma processing systems, inductively coupled plasma processing systems and transformer coupled plasma processing systems.

6. A method as defined in claim 1, wherein in the step of forming an intermediate resist layer, the substrate temperature is from about 50° C. to about 150° C.

7. A method as defined in claim 1, wherein said lower resist pattern includes sharp lines having a width of about 0.35 μm and substantially perpendicular side surfaces.

8. A method as defined in claim 1, wherein the upper resist layer is a chemically amplified negative resist coating.

9. A method as defined in claim 1, wherein the lower resist layer is an organic material selected from photosensitive resins and non-photosensitive resins.

10. A method as defined in claim 1, wherein the intermediate resist layer comprises $SiO_2$ and in the step of etching the intermediate resist layer, a mixture of $CHF_3$ and $CH_2F_2$ is used as the etching gas.

11. A method as defined in claim 1, wherein the intermediate resist layer comprises $Si_3N_4$ and in the step of etching the intermediate resist layer, a mixture of $CHF_3$ and $O_2$ is used as the etching gas.

12. A method as defined in claim 1, wherein in the step of etching the lower resist layer, an etching gas selected from $CO_2$ and a mixture of $O_2$ and a sulfur halide is used as the etching gas.

* * * * *